(12) United States Patent
Baek et al.

(10) Patent No.: US 9,354,461 B1
(45) Date of Patent: May 31, 2016

(54) METHOD OF MANUFACTURING DISPLAY PANEL

(71) Applicant: SAMSUNG DISPLAY CO., LTD., Yongin-si, Gyeonggi-Do (KR)

(72) Inventors: Seung-Jin Baek, Suwon-si (KR); Myung Hwan Park, Suwon-si (KR); Bo Ram Lee, Seongnam-si (KR); Kun Hee Jo, Yongin-si (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 0 days.

(21) Appl. No.: 14/856,583

(22) Filed: Sep. 17, 2015

(30) Foreign Application Priority Data

Feb. 2, 2015 (KR) ........................ 10-2015-0016347

(51) Int. Cl.
| | |
|---|---|
| *H01L 21/00* | (2006.01) |
| *G02F 1/1333* | (2006.01) |
| *H01L 27/12* | (2006.01) |
| *H01L 21/683* | (2006.01) |
| *G02F 1/1368* | (2006.01) |
| *G02F 1/1335* | (2006.01) |

(52) U.S. Cl.
CPC ............ *G02F 1/1333* (2013.01); *G02F 1/1368* (2013.01); *G02F 1/133516* (2013.01); *H01L 21/6835* (2013.01); *H01L 27/1259* (2013.01); *H01L 2221/6835* (2013.01); *H01L 2221/68377* (2013.01)

(58) Field of Classification Search
None
See application file for complete search history.

(56) References Cited

U.S. PATENT DOCUMENTS

| | | | |
|---|---|---|---|
| 8,753,905 B2 * | 6/2014 | Lee | ........................ H01L 51/56 |
| | | | 257/E21.001 |
| 2014/0051192 A1 | 2/2014 | Lee et al. | |
| 2014/0065916 A1 | 3/2014 | Lee et al. | |

FOREIGN PATENT DOCUMENTS

| | | |
|---|---|---|
| JP | 2006-139241 A | 6/2006 |
| KR | 10-2006-0134934 A | 12/2006 |
| KR | 10-2010-0084865 A | 7/2010 |

* cited by examiner

*Primary Examiner* — Jack Chen
(74) *Attorney, Agent, or Firm* — Lee & Morse, P.C.

(57) ABSTRACT

A method of manufacturing a display panel, the method including attaching a first carrier substrate to a first substrate; attaching a second carrier substrate to a second substrate; forming a thin film transistor (TFT) array on the first substrate; forming a color filter (CF) array on the second substrate; and coupling the first substrate with the second substrate to provide coupled first and second substrates, the first substrate being bonded to the first carrier substrate with a first intermediate layer therebetween, the second substrate being bonded to the second carrier substrate with a second intermediate layer therebetween, and an adhesive force of the first intermediate layer being weaker than an adhesive force of the second intermediate layer.

11 Claims, 11 Drawing Sheets

METHOD OF MANUFACTURING DISPLAY PANEL

CROSS-REFERENCE TO RELATED APPLICATION

Korean Patent Application No. 10-2015-0016347, filed on Feb. 2, 2015, in the Korean Intellectual Property Office, and entitled: "Method Of Manufacturing Display Panel," is incorporated by reference herein in its entirety.

BACKGROUND

1. Field

The described technology relates to a method of manufacturing a display panel.

2. Description of the Related Art

With advances in technology and a rapid increase in the amount of information communicated, the role of display devices that are media outputting information may be increasingly important. Among display devices, a liquid crystal display may exhibit, for example, excellent resolution, color display, and image quality.

SUMMARY

Embodiments may be realized by providing a method of manufacturing a display panel, the method including attaching a first carrier substrate to a first substrate; attaching a second carrier substrate to a second substrate; forming a thin film transistor (TFT) array on the first substrate; forming a color filter (CF) array on the second substrate; and coupling the first substrate with the second substrate to provide coupled first and second substrates, the first substrate being bonded to the first carrier substrate with a first intermediate layer therebetween, the second substrate being bonded to the second carrier substrate with a second intermediate layer therebetween, and an adhesive force of the first intermediate layer being weaker than an adhesive force of the second intermediate layer.

Each of the first and second intermediate layers may include an inorganic material or an organic material.

The first intermediate layer may include hexamethyldisilazane (HMDS).

The second intermediate layer may include indium tin oxide (ITO), indium zinc oxide (IZO), gallium zinc oxide (GZO), or aluminum zinc oxide (AZO).

The method may further include disposing the coupled first and second substrates so that the first carrier substrate is on an uppermost portion of the coupled first and second substrates.

The method may further include separating the first carrier substrate from the coupled first and second substrates.

The first intermediate layer may be separated along with the first carrier substrate.

The method may further include disposing the first and second substrates from which the first carrier substrate is removed, so that the second carrier substrate is on the uppermost portion.

The method may further include separating the second carrier substrate from the first and second substrates from which the first carrier substrate is removed.

The second intermediate layer may remain on the second substrate even after separating the second carrier substrate.

A liquid crystal layer may be between the coupled first and second substrates.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
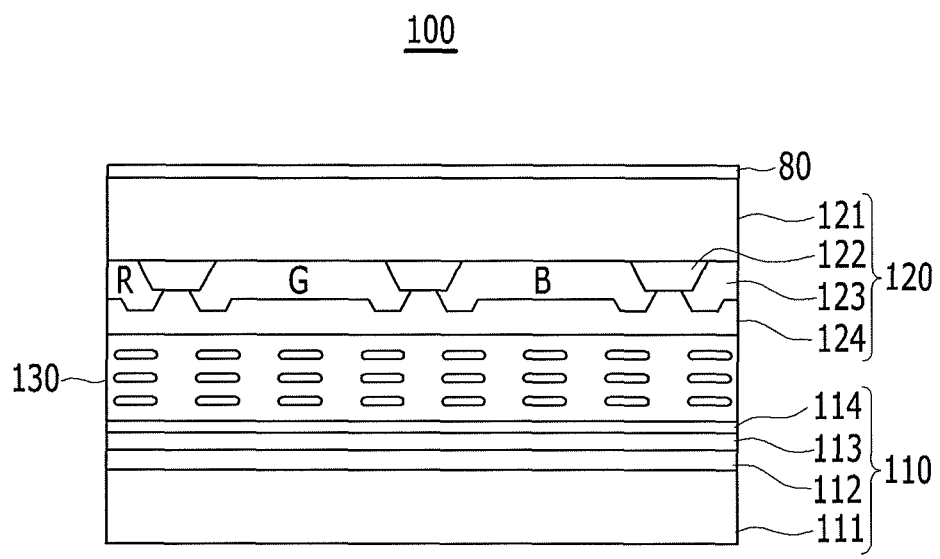
FIG. 1 illustrates a cross-sectional view of a display panel according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Before describing a method of manufacturing a display panel according to an exemplary embodiment, a configuration of a display panel manufactured by a method of manufacturing a display panel will be briefly described below with reference to FIG. 1.

FIG. 1 illustrates a cross-sectional view of a display panel according to an exemplary embodiment.

A display panel 100 may include a thin film transistor (TFT) array substrate 110 and a color filter (CF) array substrate 120 which may be coupled with each other with a liquid crystal layer 130 therebetween.

The TFT array substrate 110 may include a first substrate 111, a TFT array 112, a pixel electrode 113, and a common electrode 114.

The first substrate 111 may be a transparent insulation substrate and may be made of a flexible material. The first substrate 111 may be made of a polymer material in a film form which has a glass transition point (Tg) of 150° C. or higher, for example, a cyclo olefin copolymer (COC) or cyclo olefin polymer (COP) based material. A thickness of the first substrate 111 may be 0.1 T (0.1 mm) or less. By this configuration, it may be possible to manufacture a display panel which is slimmer than a comparative display panel manufactured by using a substrate having a thickness of 0.5 T to 0.7 T.

The TFT array 112 may be configured by a plurality of TFTs disposed on the first substrate 111 in a matrix form.

The pixel electrode 113 may be made of indium tin oxide (ITO) or indium zinc oxide (IZO) which may be a transparent conductive inorganic material.

The common electrode 114 may be formed on the pixel electrode 113 and made of ITO or IZO which may be a transparent conductive inorganic material.

In an embodiment, the position of the common electrode 114 may differ, for example, the common electrode 114 may be first stacked below the pixel electrode 113.

The CF array substrate 120 may include a second substrate 121, light blocking layers 122, a CF layer 123, and a planarization layer 124.

The second substrate 121 may be a transparent insulation substrate and may be made of a flexible material. The second substrate 121 may be a substrate which may be formed of the same material as that of the first substrate 111.

The light blocking layers 122 may be provided between red (R), green (G) and blue (B) color pixels, and may divide regions where the color pixels may be formed, and color reproducibility of the color pixels may be improved.

The CF layer 123 may be configured by red (R), green (G) and blue (B) color pixels, and may be formed on the second substrate 121.

The planarization layer 124 may be provided on the CF layer 123 and the light blocking layers 122, and a step generated in an overlapping region between the light blocking layer 122 and the color pixels may be reduced.

The liquid crystal layer 130 may be interposed between the TFT array substrate 110 and the CF array substrate 120. The liquid crystal layer 130 may be classified into, for example, a vertical alignment (VA) mode, a horizontal electric field driving mode, e.g., a plane line switching (PLS) mode or an in-plane switching (IPS) mode, or a twisted nematic (TN) mode, according to a driving method of a display device.

In an exemplary embodiment, the disposition structures of the liquid crystal layer 130 and the display panel 100 in the horizontal electric field driving mode (the PLS mode or the IPS mode), in which the liquid crystal molecules may be driven in a horizontal direction to the substrate to improve a viewing angle up to 170 degrees or larger, have been described as an example. An exemplary embodiment may also be applied to the liquid crystal layer 130 and the display panel 100 in the TN mode or the VA mode in which liquid crystal molecules may be driven in a vertical direction to the substrate.

Hereinafter, the method of manufacturing the display panel 100 as described above will be described with reference to FIGS. 2 to 11.

Figure 2:
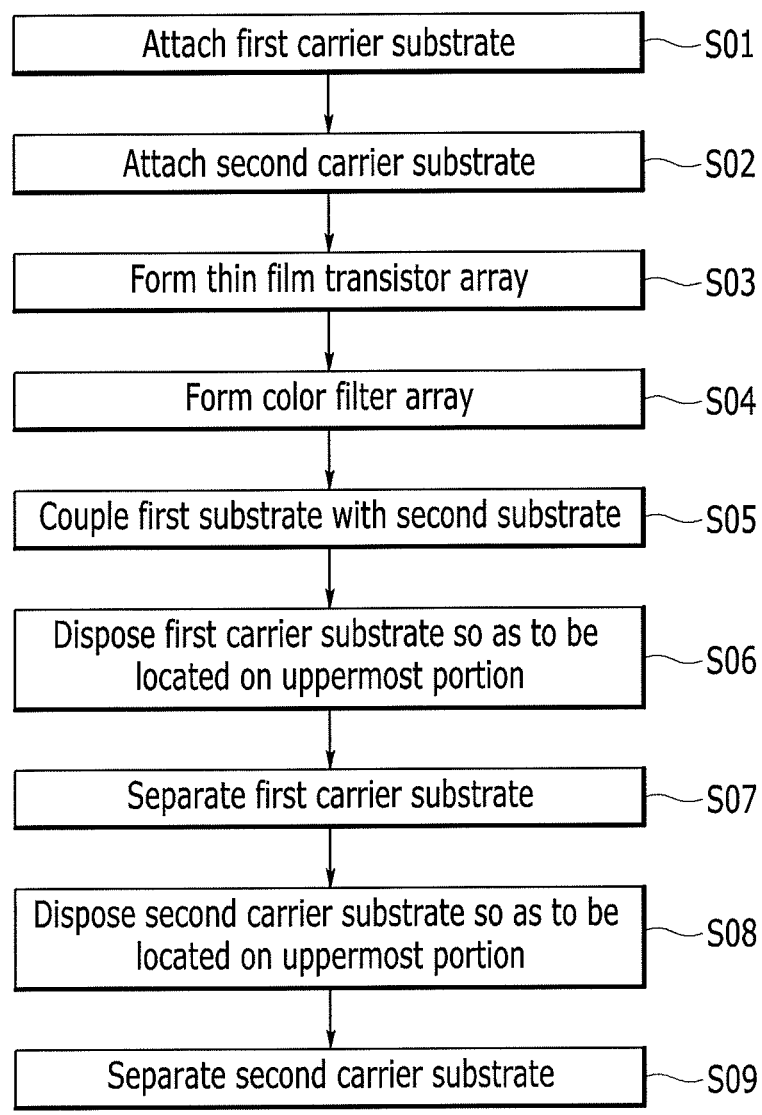
FIG. 2 illustrates a flowchart of a method of manufacturing a display panel according to an exemplary embodiment.

FIG. 2 illustrates a flowchart of a method of manufacturing a display panel according to an exemplary embodiment, and FIGS. 3 to 11 illustrate diagrams of a method of manufacturing a display panel according to an exemplary embodiment.

Referring to FIG. 2, an exemplary embodiment may include attaching a first carrier substrate to a first substrate (S01), attaching a second carrier substrate to a second substrate (S02), forming a TFT array on the first substrate (S03), forming a CF array on the second substrate (S04), coupling the first substrate with the second substrate (S05), disposing the coupled first and second substrates so that the first carrier substrate is located on the uppermost portion (S06), separating the first carrier substrate from the coupled first and second substrates (S07), disposing the first and second substrates from which the first carrier substrate is removed, so that the second carrier substrate is located on the uppermost portion (S08), and separating the second carrier substrate from the first and second substrates from which the first carrier substrate is removed (S09).

Figure 3:
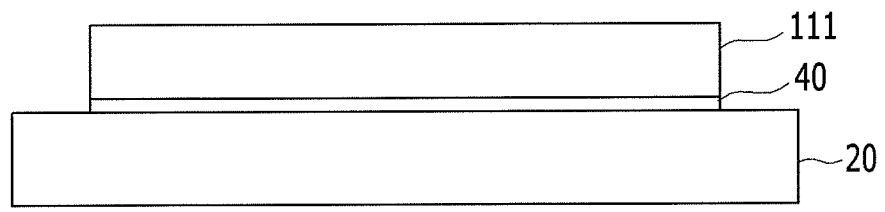
FIGS. 3 to 11 illustrate diagrams of a method of manufacturing a display panel according to an exemplary embodiment.

First, in attaching the first carrier substrate (S01), as illustrated in FIG. 3, the first substrate 111 may be disposed on the first carrier substrate 20, and a first intermediate layer 40 may be disposed between the first substrate 111 and the first carrier substrate 20. The first intermediate layer 40 may need to be separated from the first substrate 111 by a subsequent process, and may be made of an organic material which may lightly attach the first substrate 111 to the first carrier substrate 20 with adhesive force of about 2N or less so that the first intermediate layer 40 may be separated along with the first carrier substrate 20 by ultraviolet rays (UV), laser or a detachment device.

In the present exemplary embodiment, the first intermediate layer 40 may be made of an organic material including hexamethyldisilazane (HDMS). Since the HDMS may be attached to the first substrate 111 and the first carrier substrate 20 to exhibit hydrophobicity, the first substrate 111 may be attached to the first carrier substrate 20 by the first intermediate layer 40. As described above, the first intermediate layer 40 may be formed between the first substrate 111 and the first carrier substrate 20, such that the first substrate 111 and the first carrier substrate 20 may be prevented from being fused, for example, due to direct contact in a subsequent process.

Figure 4:
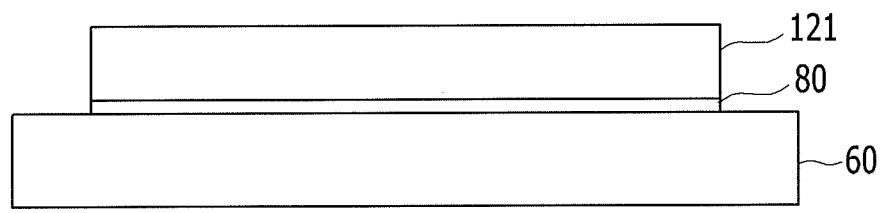

Then, in the attaching of the second carrier substrate (S02), as illustrated in FIG. 4, the second substrate 121 may be disposed on the second carrier substrate 60, and a second intermediate layer 80 may be disposed between the second substrate 121 and the second carrier substrate 60. The second intermediate layer 80 may be made of an inorganic material having strong adhesive force with the second substrate 121 so that the second intermediate layer 80 remains on the second substrate 121 even though the second carrier substrate 60 may be separated by a subsequent process.

In the present exemplary embodiment, the second intermediate layer 80 may be made of the inorganic material having stronger adhesive force than that of the first intermediate layer 40. In the present exemplary embodiment, the second intermediate layer 80 may be formed of ITO or IZO having adhesive force of, for example, 3 N or more. The second intermediate layer 80 having adhesive force of 3 N or more may also be formed of gallium zinc oxide (GZO) or aluminum zinc oxide (AZO).

The second intermediate layer 80 may be made of the material having stronger adhesive force than that of the first intermediate layer 40, but the material may have smaller adhesive force than a pressure sensitive adhesive or an optical clear resin which may be used to laminate a layer, and after separating the second carrier substrate 60, the second intermediate layer 80 may also be separated from the second substrate 121.

Figure 5:
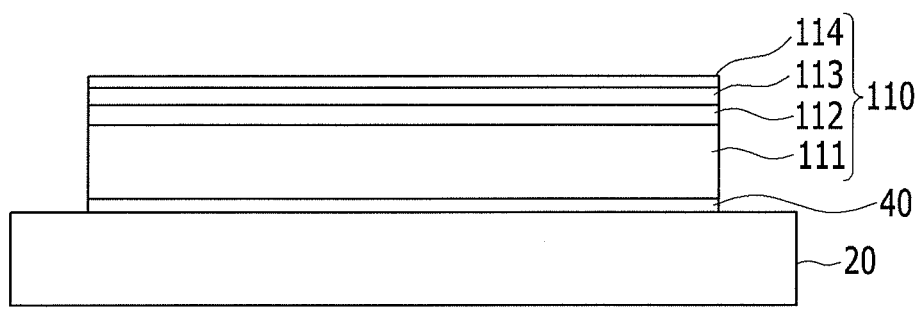

In forming the TFT array (S03), as illustrated in FIG. 5, the TFT array 112, a pixel electrode 113, and a common electrode 114 may be formed on the first substrate 111. The TFT array 112 and the pixel electrode 113 may be formed on the first substrate 111 under a process condition of about 320° C.

For example, he TFT array 112 may include a plurality of gate lines, a plurality of data lines, and a plurality of pixel areas arranged in which the plurality of gate lines and the plurality of data lines may be arranged in a matrix form while being orthogonal to each other. The TFT array 112 may include a TFT which may be formed in each of the pixel areas. The pixel electrode 113 may be made of ITO or IZO. Two or more pixel electrodes 113 may be formed so as to be connected to the TFT formed in each of the pixel areas, respectively. The common electrode 114 may be formed on or below the pixel electrode 113 to correspond to the pixel electrode 113.

One common electrode 114 and one pixel electrode 113 are illustrated in FIG. 5 for convenience, but a plurality of common electrodes 114 and a plurality of pixel electrodes 113 may be substantially formed. The TFT array substrate 110 may be formed by the process.

Figure 6:
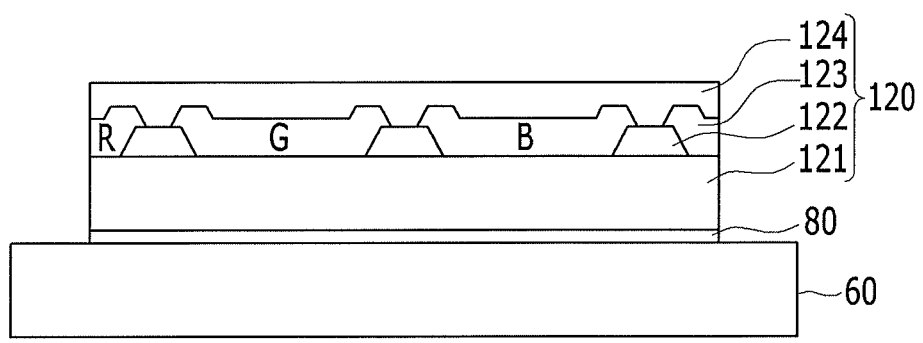

In forming the CF array (SO4), as illustrated in FIG. 6, a light blocking layer 122, a color filter (CF) layer 123, and a planarization layer 124 may be formed on the second substrate 121. The light blocking layer 122 and the CF layer 123 may be formed on the second substrate 121 under a process condition of about 230° C.

For example, the light blocking layer 122 may be formed of an organic material such as black carbon (C), or a metal material such as chromium (Cr) or a chromium oxide ($CrO_x$) layer. The CF layer 123 may be formed of a dye material which may display red (R), green (G) and blue (B) colors. The planarization layer 124 may be formed to cover the light blocking layer 122 and the CF layer 123. The display panel of an exemplary embodiment may be in the VA mode or the NT mode, and the common electrode 114 of FIG. 6 may be omitted, while a common electrode may be formed on the planarization layer 124 with ITO or IZO. The CF array substrate 120 may be formed by the process.

Figure 7:
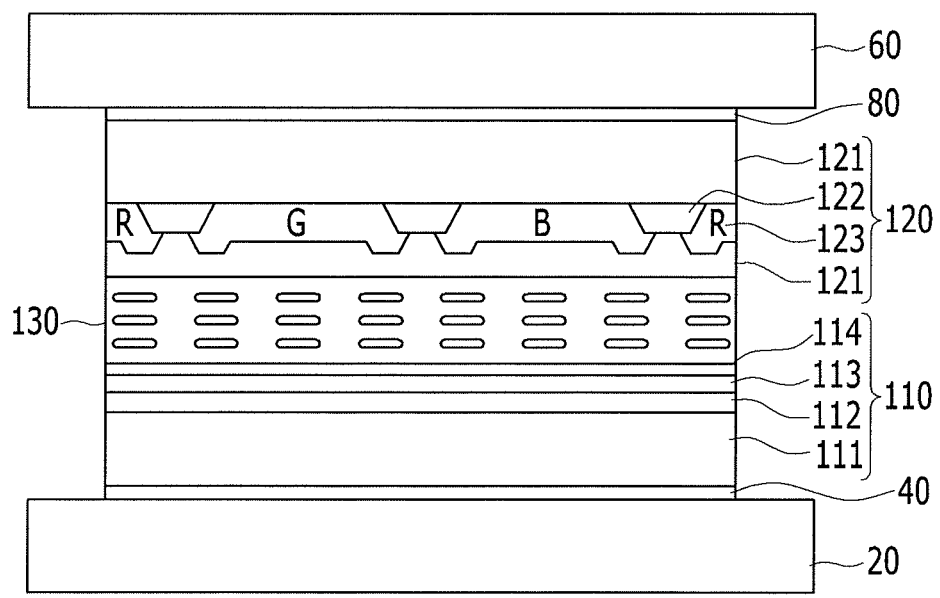

In coupling the first and second substrates (S05), as illustrated in FIG. 7, the TFT array substrate 110 may be coupled with the CF array substrate 120 with the liquid crystal layer 130 therebetween. To form a closed loop in one of the TFT array substrate 110 and the CF array substrate 120, a sealant may be applied and a liquid crystal may be dripped into the inside of the sealant. Subsequently, the TFT array substrate 110 may be coupled with the CF array substrate 120 by using the sealant.

Figure 8:
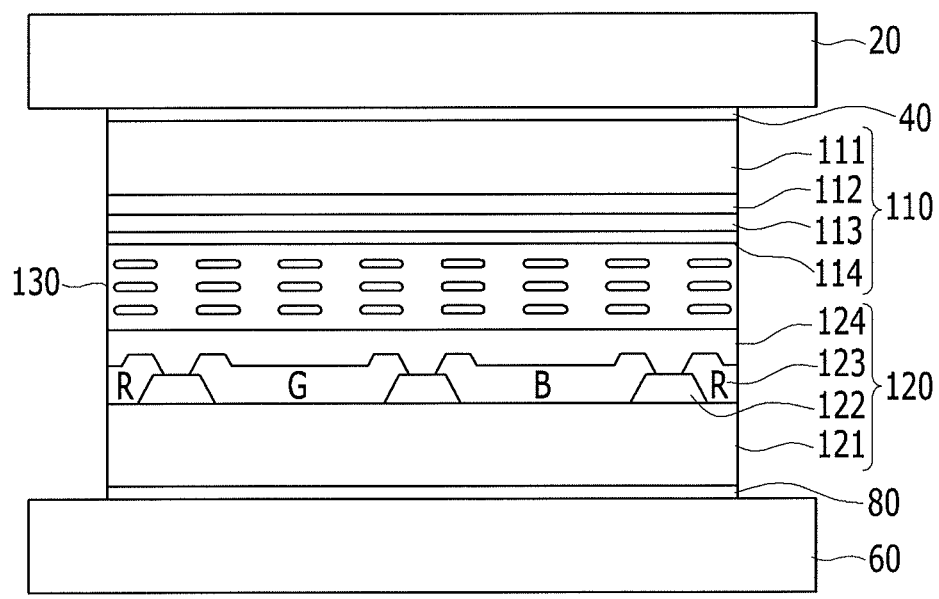

In disposing the first carrier substrate so as to be located on the uppermost portion (S06), as illustrated in FIG. 8, the substrates coupled in coupling the first and second substrates (S05) may be turned upside down, such that the first carrier substrate 20 may be disposed to be located on the uppermost portion.

In an exemplary embodiment, to sequentially separate the first carrier substrate 20 and the second carrier substrate 60 by a physical separation method such as a vacuum detachment device, the first carrier substrate 20 having relatively weak adhesive force may be disposed to be located on the uppermost portion. A vacuum detachment jig may be attached to an upper portion of the first carrier substrate 20, and a lower portion of the second carrier substrate 60 may be disposed on and fixed to a detachment stage.

Figure 9:
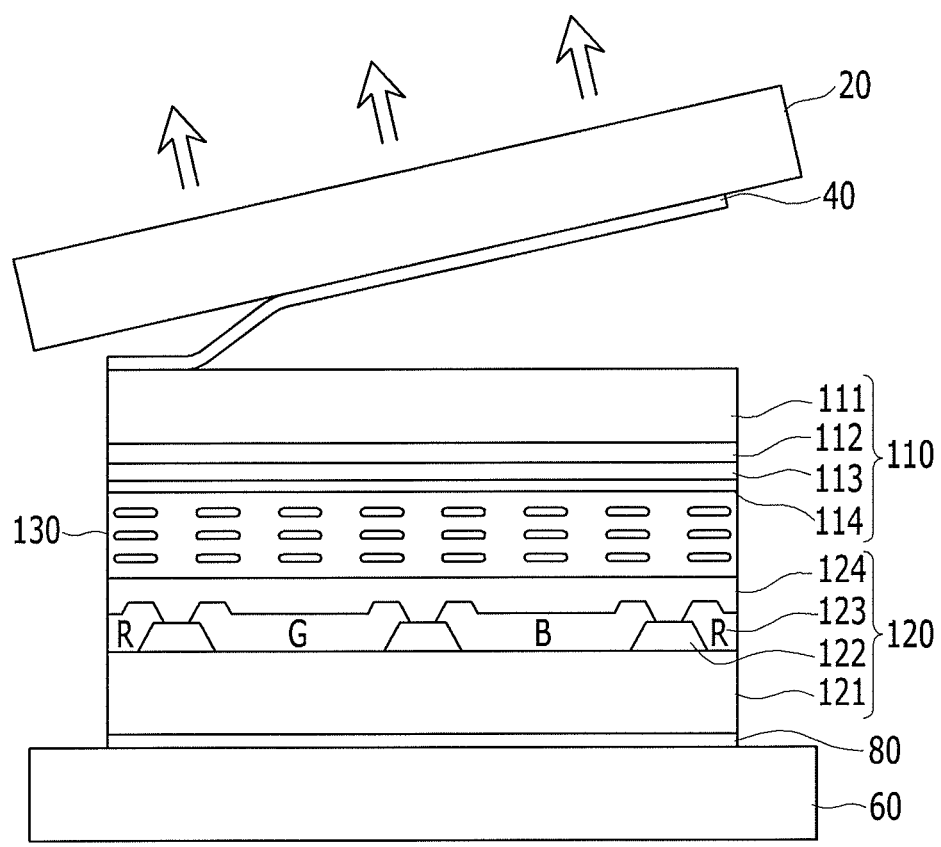

Next, in separating the first carrier substrate (S07), as illustrated in FIG. 9, the vacuum deposition jig may be moved in an arrow direction, such that the first carrier substrate 20 may be separated from the first substrate 111.

In an exemplary embodiment, the vacuum deposition jig may be lifted with force of more than 2 N and less than 3 N, the first intermediate layer 40 may lose adhesive force to the first carrier substrate 20 and the first substrate 111, and the second intermediate layer 80 may not be affected at all. The first intermediate layer 40 may be removed along with the first carrier substrate 20 at the time of separating the first carrier substrate 20, and even when there is a portion which is left without being removed, the remaining portion may not have very strong adhesive force with the first substrate 111, and may be easily removed.

As described above, the second carrier substrate 60 may be configured to be fixed during the process of separating the first carrier substrate 20 by making the adhesive force of the first intermediate layer 40 and the second intermediate layer 80 different, such that it may be possible to prevent the second carrier substrate 60 from being simultaneously separated while separating the first carrier substrate 20 and the liquid crystal panel from being damaged, for example, due to the simultaneous separation.

Figure 10:
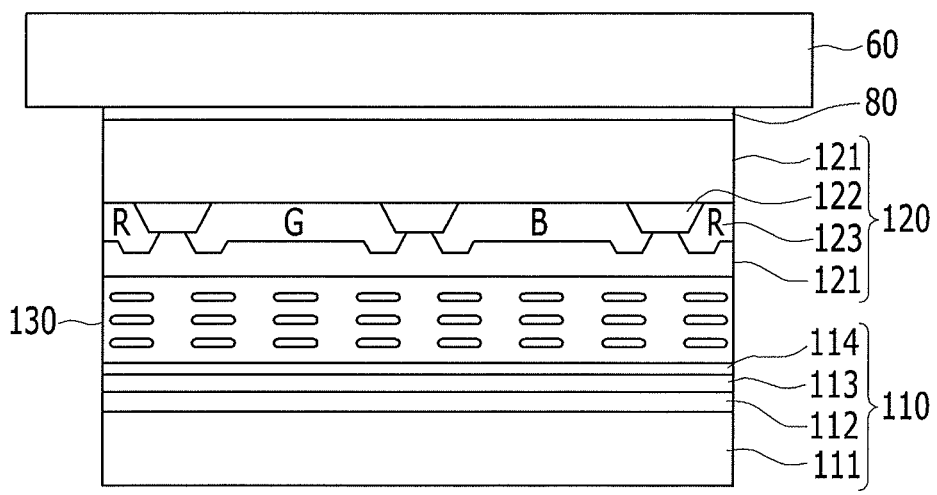

In disposing the second carrier substrate so as to be located on the uppermost portion (S08), as illustrated in FIG. 10, the second carrier substrate 60 may be disposed to be located on the uppermost portion by turning the first and second substrates, from which the first carrier substrate 20 and the first intermediate layer 40 may be removed, upside down in separating the first carrier substrate (S07). A vacuum detachment jig may be attached to an upper portion of the second carrier substrate 60, and a lower portion of the first substrate 111 may be disposed on and fixed to a detachment stage.

Figure 11:
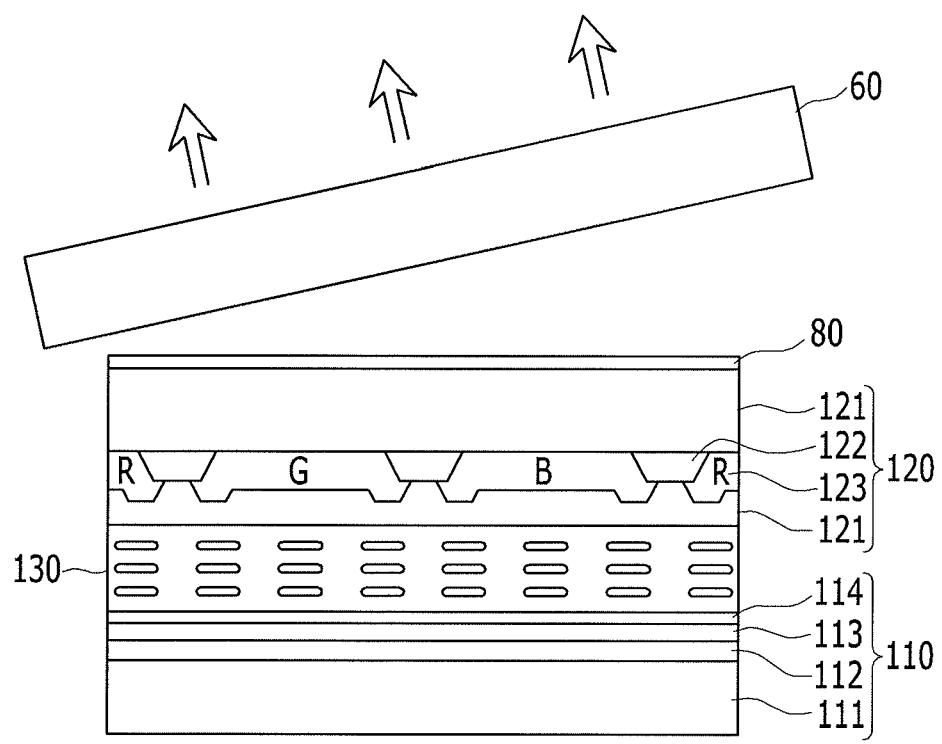

Next, in separating the second carrier substrate (S09), as illustrated in FIG. 11, the vacuum detachment jig may be moved to an arrow direction, and the second carrier substrate 60 may be separated from the second substrate 121.

In an exemplary embodiment, the vacuum deposition jig may be lifted with force of more than 3 N, the second intermediate layer 80 may lose adhesive force to the second carrier substrate 60 and the second substrate 121, and the second intermediate layer 80 may not be affected at all. The second intermediate layer 80 may be removed along with the second carrier substrate 60 at the time of separating the second carrier substrate 60, but force lifting the vacuum deposition jig may be controlled so as to be force near the maximum static friction force corresponding to the adhesive force of the second intermediate layer 80 while being gradually increased, such that as illustrated in FIG. 11, only the second carrier substrate 60 may be separated from the second substrate 121, and the second intermediate layer 80 may remain on the second substrate 121 as illustrated in FIG. 2 above.

As described above, according to a method of manufacturing a display panel according to an exemplary embodiment, the first and second carrier substrates 20 and 60 may be sequentially separated easily by using the physical separation method, and it may be possible to prevent damage to the display panel 100 which may occur during the separation process. Provided is a method of manufacturing a display panel by which the inferiority rate of the carrier separation process may be reduced.

According to a method of manufacturing a display panel according to an exemplary embodiment, it may be possible to control the second intermediate layer 80 to remain on the second substrate 121 even after the second carrier substrate 60 is separated, such that when the display panel 100 manufactured by the above-described method is used in the liquid crystal display in the PLS or IPS mode, there may not be a need to perform a separate process of depositing an inorganic layer made of, for example, ITO, to prevent electrostatic discharge (ESD). A method of manufacturing a display panel having the reduced number of processes may be provided.

By way of summation and review, a liquid crystal display is a device in which two substrates each having field generating electrodes formed thereon may be disposed so that surfaces with two electrodes formed thereon face each other, a liquid crystal material may be injected between the two substrates, and then liquid crystal molecules may be moved by an electric field generated by applying a voltage to the two electrodes, and an image may be displayed by transmittance of light changed depending on the movement of the liquid crystal molecules.

The liquid crystal display may include a liquid crystal panel which may include a color filter substrate, a thin film transistor array substrate, and a liquid crystal layer interposed therebetween to display an image. Upper and lower polarizers may be provided on and below the liquid crystal panel, respectively. The lower polarizer may polarize light incident on the liquid crystal panel and the upper polarizer may polarize light emitted from the liquid crystal panel.

The liquid crystal display may need to separate carrier substrates attached to both sides during a liquid crystal panel manufacturing process, individually, and the same adhesive material may be used for adhesive layers attaching the carrier substrates to both sides of the liquid crystal panel, and adhesive force of the adhesive layers may be the same as or almost similar to each other.

For example, in a case of a method of sequentially separating an upper carrier substrate and a lower carrier substrate by a physical method using a vacuum detachment device, when the adhesive force of the adhesive layers is the same, the adhesive layer positioned below the detachment device may be peeled off before the adhesive layer positioned on the detachment device is peeled off, and damage of the liquid crystal panel, for example, due to concentration of stress, may occur.

Provided is a method of manufacturing a display panel that may be capable of preventing a liquid crystal panel from being damaged during a carrier substrate separating process by making adhesive force of adhesive layers attaching carrier substrates to both sides of the liquid crystal panel, respectively, different.

According to an exemplary embodiment, in a method of manufacturing a display panel, since the second intermediate layer has weaker adhesive force than the first intermediate layer, the first carrier substrate and the second carrier substrate may be sequentially separated easily, and the liquid crystal panel may be prevented from being damaged during the carrier substrate separation process.

According to an exemplary embodiment, when a method of manufacturing a display panel is used in a liquid crystal display in a plane line switching (PLS) mode or an in-plane switching (IPS) mode, an inorganic layer may remain on the rear surface of the second substrate even after the second carrier substrate is separated, such that there may be no need to perform a separate ITO deposition process for preventing electrostatic discharge (ESD) after the carrier substrate separation process.

The described technology relates to a method of manufacturing a display panel that may be capable of preventing a liquid crystal panel from being damaged during a carrier substrate separation process.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a display panel, the method comprising:
    attaching a first carrier substrate to a first substrate;
    attaching a second carrier substrate to a second substrate;
    forming a thin film transistor (TFT) array on the first substrate;
    forming a color filter (CF) array on the second substrate; and
    coupling the first substrate with the second substrate to provide coupled first and second substrates,
    the first substrate being bonded to the first carrier substrate with a first intermediate layer therebetween, the second substrate being bonded to the second carrier substrate with a second intermediate layer therebetween, and an adhesive force of the first intermediate layer being weaker than an adhesive force of the second intermediate layer.

2. The method as claimed in claim 1, wherein each of the first and second intermediate layers includes an inorganic material or an organic material.

3. The method as claimed in claim 2, wherein the first intermediate layer includes hexamethyldisilazane (HMDS).

4. The method as claimed in claim 2, wherein the second intermediate layer includes indium tin oxide (ITO), indium zinc oxide (IZO), gallium zinc oxide (GZO), or aluminum zinc oxide (AZO).

5. The method as claimed in claim 2, further comprising disposing the coupled first and second substrates so that the first carrier substrate is on an uppermost portion of the coupled first and second substrates.

6. The method as claimed in claim 5, further comprising separating the first carrier substrate from the coupled first and second substrates.

7. The method as claimed in claim 6, wherein the first intermediate layer is separated along with the first carrier substrate.

8. The method as claimed in claim 6, further comprising disposing the first and second substrates from which the first carrier substrate is removed, so that the second carrier substrate is on the uppermost portion.

9. The method as claimed in claim 8, further comprising separating the second carrier substrate from the first and second substrates from which the first carrier substrate is removed.

10. The method as claimed in claim 9, wherein the second intermediate layer remains on the second substrate even after separating the second carrier substrate.

11. The method as claimed in claim 10, wherein a liquid crystal layer is between the coupled first and second substrates.

* * * * *